United States Patent
Huang et al.

(10) Patent No.: US 6,232,206 B1
(45) Date of Patent: May 15, 2001

(54) METHOD FOR FORMING ELECTROSTATIC DISCHARGE (ESD) PROTECTION TRANSISTORS

(75) Inventors: Tiao-Yuan Huang; Horng-Chih Lin, both of Hsinchu (TW)

(73) Assignee: National Science Council (TW)

( * ) Notice: Subject to any disclaimer, the term of this patent is extended or adjusted under 35 U.S.C. 154(b) by 0 days.

(21) Appl. No.: 09/208,409

(22) Filed: Dec. 10, 1998

(30) Foreign Application Priority Data

Dec. 10, 1997 (TW) ................................. 86118630

(51) Int. Cl.[7] .................... H01L 21/425; H01L 21/469
(52) U.S. Cl. ...................... 438/528; 438/766; 438/966; 257/638
(58) Field of Search .......................... 438/200, 217, 438/299, 786, 528, 766, 966

(56) References Cited

U.S. PATENT DOCUMENTS

| 5,342,798 | 8/1994 | Huang . |
| 5,413,969 | 5/1995 | Huang . |
| 5,908,313 | * 6/1999 | Chau et al. ........................... 438/299 |
| 5,933,721 | * 8/1999 | Hause et al. ......................... 438/217 |
| 6,022,769 | * 2/2000 | Wu ....................................... 439/200 |
| 6,033,998 | * 3/2000 | Aronowitz et al. ................. 438/786 |
| 6,114,257 | * 9/2000 | Ronsheim ........................... 438/779 |

OTHER PUBLICATIONS

T. Kuroi et al., Novel NICE (Nitrogen Implantation into CMOS Gate Electrode and Source/Drain) Structure for Hig Performance 0.25um Dual Gate CMOS, IDEM Dec. 1993, pp. 325–328.*

(1) Doyle et al., Simultaneous Growth of Different Thickness Gate Oxides in Silicon CMOS Processing (1995) IEEE Electron Device Letters, vol. 16, No. 7, p. 301–302.

* cited by examiner

Primary Examiner—Long Pham
Assistant Examiner—William David Coleman

(57) ABSTRACT

A method is provided for selective oxidation on source/drain regions of transistors on an integrated circuit. The method includes the steps of a) incorporating a neutral species into first kind of the source/drain regions, and b) forming oxidation regions over the first kind of source/drain regions and second kind of the source/drain regions, wherein the oxidation regions over the second kind are thicker than the oxidation regions over the first kind.

11 Claims, 2 Drawing Sheets

METHOD FOR FORMING ELECTROSTATIC DISCHARGE (ESD) PROTECTION TRANSISTORS

FIELD OF THE INVENTION

The present invention is related to a method for selective oxidation on source/drain regions of transistors of an integrated circuit.

BACKGROUND OF THE INVENTION

In the manufacturing process of the integrated circuit, it is important to form a thin silicide layer on the source/drain regions of the transistors in order to reduce the resistance of the source/drain regions for maintaining high performance of the transistor and resultant circuits. The silicication on the source/drain regions can be achieved by a simple silicidation on the source/drain regions alone or by the self-aligned silicidation on the source/drain regions and the gate regions of the transistors. It has been well known that the electrostatic discharge (ESD) robustness is a critical parameter of the product of the resultant circuits. However, it is severely impaired by the silicidation. Therefore, several methods have been developed to prevent the electrostatic discharge protection of the transistor from getting worsen due to the silicidation. One method is to utilize the selective implantation of phosphorus ion or arsenic ion into the source/drain regions of the transistors for allowing the growth of a thicker oxide and preventing the silicidation on the source/drain regions. However, phosphorus ion and arsenic ion, both of which are active dopants to silicon, will significantly affect the drain engineering structure of ESD transistor that is not compatible with the design for the deep sub-micron device. Furthermore, this kind of method is only suitable for avoiding the silicidation on n-channel ESD transistors, but not simultaneously on n-channel and p-channel ESD transistors. It is the purpose of the present invention to deal with the above situation encountered by the prior art.

SUMMARY OF THE INVENTION

An object of the present invention is to provide a method for selective oxidation on source/drain regions of transistors on an integrated circuit.

According to the present invention, the method includes the steps of a) incorporating a neutral species into the first kind of source/drain regions, and b) forming oxidation regions over the first kind of source/drain regions and second kind of source/drain regions, wherein the oxidation regions over the second kind are thicker than the oxidation regions over the first kind.

In accordance with one aspect of the present invention, the neutral species is incorporated into the first kind of source/drain regions by ion implantation. Preferably, the neutral species is nitrogen. Nitrogen is implanted into the first kind of source/drain regions and an annealing process is performed at 900° C. for 20 seconds in the presence of nitrogen. The concentration of the neutral species implanted into the first kind of source/drain regions is about $1\times10^{15}$ cm$^{-2}$.

In accordance with another aspect of the present invention, each of the oxidation regions over the second kind of source/drain regions has a thickness of more than 50 Å and each of the oxidation regions over the first kind has a thickness ranged from 10 Å to 15 Å.

In accordance with another aspect of the present invention, the step (b) is performed by thermal oxidation, preferably under the condition of 900° C., 500 torr for 120 seconds.

After the step (b), the method further includes the steps of c) forming a metal layer over the first and second kinds of the source/drain regions and d) performing a salicidation to form silicide regions on the first kind. In addition, the method further includes a step after the step (d) to remove the unreacted metal layer on the second kind.

The present invention may best be understood through the following description with reference to the accompanying drawings, in which:

DETAILED DESCRIPTION OF THE PREFERRED EMBODIMENT

Figure 1A:
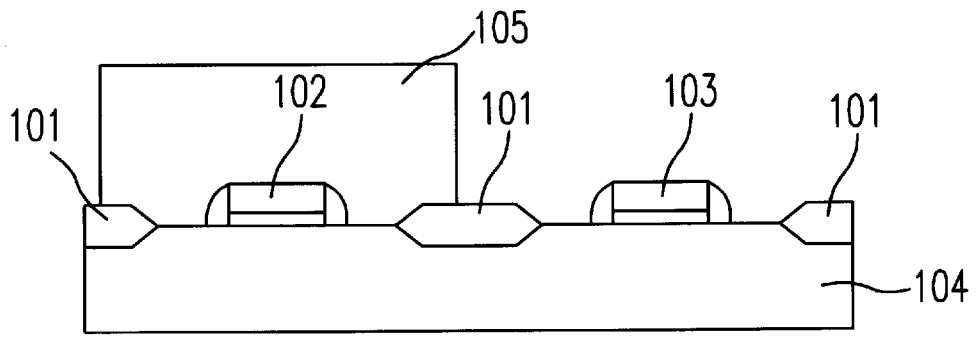
FIGS. 1(a)~(e) are schematic diagrams showing a preferred embodiment of a method for selective oxidation on source/drain regions of transistors on an integrated circuit according to the present invention.
Figure 1B:
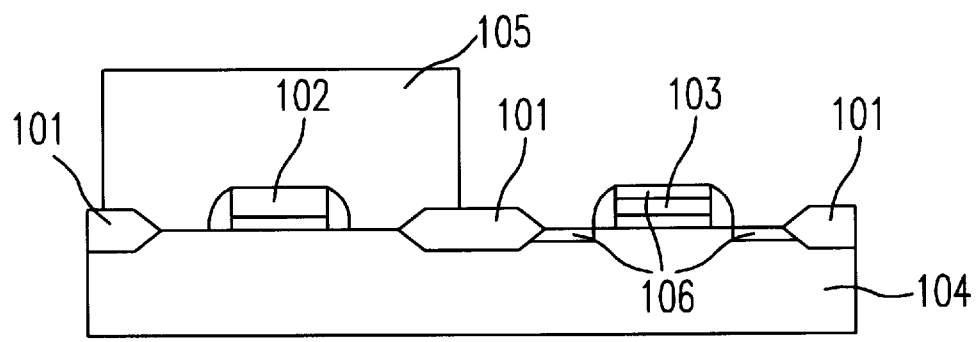
Figure 1C:
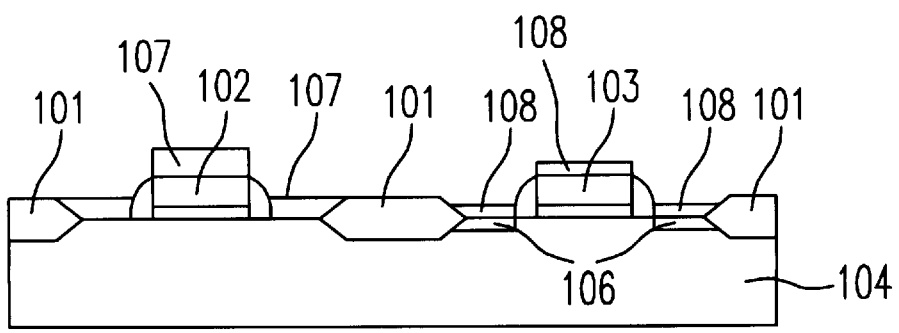

The present invention provides a method for selective oxidation on source/drain regions of transistors on an integrated circuit. As shown in FIGS. 1(a)~(c), a wafer 104 including two transistors 102, 103 is used as an example, wherein the transistor 102 is isolated from the transistor 103 by a field oxide 101.

In FIG. 1(a), the transistor 102 is covered by a photoresist 105 and then a neutral species is incorporated into the source/drain regions 106 of the transistor 103 by ion implantation. Preferably, the neutral species is nitrogen. Nitrogen is implanted into the source/drain regions 106 and an annealing process is performed at 900° C. for 20 seconds in the presence of nitrogen. The concentration of nitrogen implanted into the source/drain regions 106 is about $1\times10^{15}$ cm$^{-2}$.

Shown in FIG. 1(c) includes two steps: 1) removing the photoresist 105 and 2) forming an oxide over these two transistors 102 and 103, wherein the oxide 107 over the transistor 102 is thicker than the oxide 108 on the transistor 103. The oxide 107 on the transistor 102 has a thickness more than 50 Å and the oxide 108 on the transistor 103 has a thickness ranged from 10 Å to 15 Å. The above-described oxidation is performed by thermal oxidation, preferably under the condition of 900° C., 500 torr for 120 seconds.

Figure 1D:
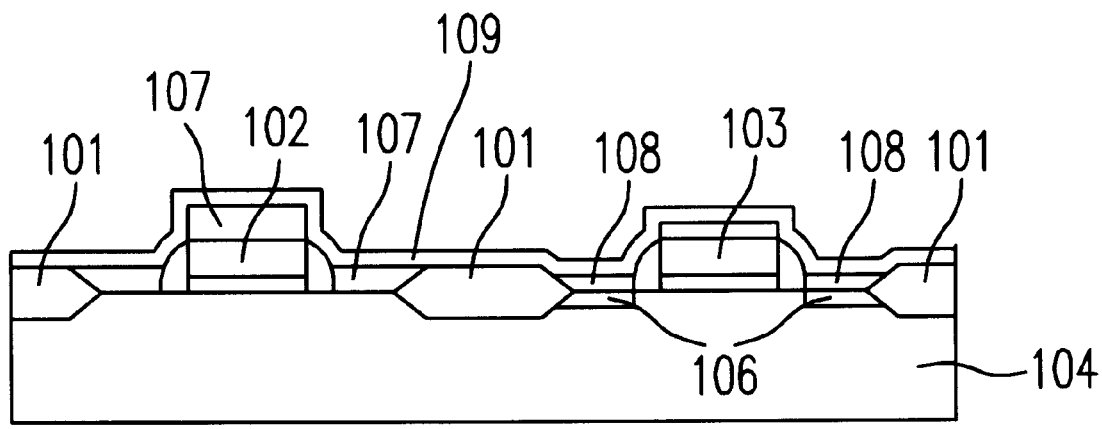
Figure 1E:
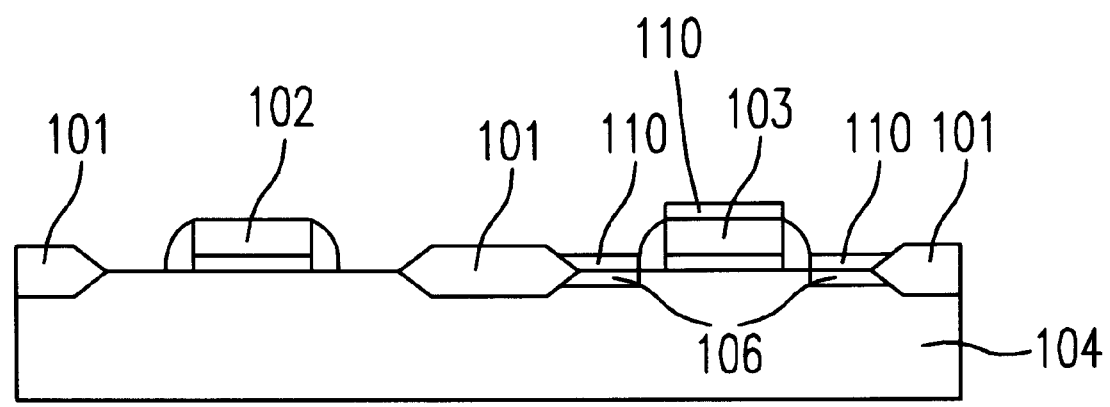

Thereafter, a metal layer 109 is formed over these two transistors 102 and 103 as can be seen in FIG. 1(d). Referring to FIG. 1(e), subsequently a salicidation is performed. The metal layer is made of titanium or cobalt and has a thickness ranged from 5 nm to 200 nm. Because there is a thick oxide 107 formed on the transistor 102, it can avoid the formation of silicide regions 110 on the transistor 102. Thus, the unreacted metal layer on the transistor 102 can be removed.

According to the present invention, the incorporation of nitrogen will result in a retardation of the formation of the oxide on the non-ESD transistors (i.e. transistors other than the ESD transistors) while a thicker oxide can be formed both on n-channel and p-channel ESD transistors. The thicker oxide on the ESD transistors can avoid the formation of the silicide in the subsequent salicidation process. In addition, since nitrogen, unlike phosphorus or arsenic, is a neutral species to silicon, the drain engineering structure of the ESD transistor will not be jeopardized.

While the invention has been described in terms of what are presently considered to be the most practical and preferred embodiments, it is to be understood that the invention need not be limited to the disclosed embodiment. On the contrary, it is intended to cover various modifications and similar arrangements included within he spirit and scope of the appended claims which are to be accorded with the broadest interpretation so as to encompass all such modifications and similar structures.

What is claimed is:

1. A method for forming electrostatic discharge (ESD) protection transistors, comprising steps of:
   a) incorporating a neutral species into first kind of source/drain regions;
   b) forming oxidation regions over said first kind of source/drain regions and second kind of source/drain regions, wherein said oxidation regions over said second kind are thicker than said oxidation regions over said first kind;
   c) forming a metal layer over said first and second kinds of source/drain regions; and
   d) performing a salicidation to form silicide regions on said first kind.

2. A method according to claim 1 wherein said neutral species is incorporated into said first kind by ion implantation.

3. A method according to claim 2 wherein said neutral species is nitrogen.

4. A method according to claim 3 wherein said nitrogen is implanted into said fist kind and an annealing process is performed in an inert ambience of nitrogen at 900° C. for 20 seconds.

5. A method according to claim 2 wherein said neutral species implanted into said fist kind has a concentration of $1\times10^{15}$ cm$^{-2}$.

6. A method according to claim 1 wherein each of said oxidation regions over said second kind has a thickness more than 50 Å.

7. A method according to claim 1 wherein each of said oxidation regions over said first kind has a thickness ranged from 10 Å to 15 Å.

8. A method according to claim 1 wherein said step (b) is performed by thermal oxidation.

9. A method according to claim 8 wherein said step (b) is executed at 900° C., 500 torr for 120 seconds.

10. A method according to claim 1 further comprising a step after said step (d) to remove said unreacted metal layer on said second kind.

11. A method according to claim 1 wherein said second kind of said source/drain regions includes n and p channel ESD-protection transistors.

* * * * *